(12) United States Patent
Somerville

(10) Patent No.: US 6,184,750 B1
(45) Date of Patent: Feb. 6, 2001

(54) CONTROL CIRCUIT DRIVEN BY A DIFFERENTIAL INPUT VOLTAGE AND METHOD FOR CONTROLLING SAME

(75) Inventor: Thomas A. Somerville, Phoenix, AZ (US)

(73) Assignee: Gain Technology, Inc., Phoenix, AZ (US)

(*) Notice: Under 35 U.S.C. 154(b), the term of this patent shall be extended for 0 days.

(21) Appl. No.: 09/321,064

(22) Filed: May 27, 1999

(51) Int. Cl.[7] .................................................. H03F 3/45
(52) U.S. Cl. .................... 330/255; 330/268; 330/265; 330/267; 330/263
(58) Field of Search .................................. 330/255, 267, 330/268, 263, 265

(56) References Cited

U.S. PATENT DOCUMENTS

| | | | | |
|---|---|---|---|---|
| 4,333,058 | * | 6/1982 | Hoover | 330/255 |
| 5,070,308 | * | 12/1991 | Padi | 330/255 |
| 5,475,343 | | 12/1995 | Bee | 330/255 |
| 5,825,228 | * | 10/1998 | Gross | 330/263 |
| 5,907,262 | * | 5/1999 | Graeme et al. | 330/255 |
| 6,028,481 | * | 2/2000 | Gerstenhaber et al. | 330/263 |

OTHER PUBLICATIONS

Charles A. Holt "Electronic Circuits Digital and Analog" John Wiley & Sons Copyright 1978, pp. 431, 432, 526 and 527.*
M. Jeroen Fonderie, Johan H. Huijsing; *Design of Low–Voltage Bipolar Operational Amplifiers*; Kluwer Academic Publishers.
J. L. Linsley Hood; *Symmetry in audio amplifier circuitry*; Electronics & Wireless World, Jan. 1985.

* cited by examiner

Primary Examiner—Michael B Shingleton
(74) Attorney, Agent, or Firm—Hickman, Coleman & Hughes, LLP

(57) ABSTRACT

The present invention teaches a variety of output stages for amplifying high speed signals while keeping distortion low and using a low supply voltage. The invention includes the use of dual complementary signal paths that include a complementary push-pull output stage. Bias circuits are used to keep the paths symmetrical and positive feedback is used to oppose output loading effects.

39 Claims, 8 Drawing Sheets

CONTROL CIRCUIT DRIVEN BY A DIFFERENTIAL INPUT VOLTAGE AND METHOD FOR CONTROLLING SAME

DESCRIPTION

1. Technical Field

The present invention is related to electronic circuits for amplifying electrical signals. In particular, the present invention teaches a variety of power amplifying output stages, control circuits for such stages, and methods for controlling these devices.

2. Background Art

Amplification circuitry can be loosely divided into two types: high bandwidth and low power amplification circuitry. In the creation of high bandwidth and low power amplification circuitry, designers have different goals in mind and thus concern themselves with different issues when designing the different types of circuitry.

For example, in the design of high bandwidth circuitry, designers are concerned with achieving high frequency and low distortion. However, most high bandwidth circuitry applications are not concerned with power efficiency issues. Thus, maintaining a low quiescent current or operating with a low supply voltage generally are not design constraints in high bandwidth circuitry.

In the design of low power circuitry, on the other hand, designers are concerned about proper operation with a low supply voltage and low supply current. However, most low power circuitry applications are not beset with frequency or distortion issues. Thus, maintaining a high frequency or low distortion generally are not design constraints in low power circuitry.

Prior Art FIG. 1 is an example of a conventional rail-to-rail output stage 10 that is a low bandwidth, low voltage circuit. The conventional rail-to-rail output stage 10 includes a common source output transistor 12, a current mirror 14, and a current source 20. The current mirror 14 is formed having a pair of transistors 16 and 18. The current source 20 drives the current mirror 14 with a bias current $I_b$, which determines the quiescent current $I_q$ in output transistor 12. Gate drive, which is provided by a preceding stage through an input 22, is amplified at output 24 by the gain of output transistor 12. However, load transistor 18 provides no symmetrical drive for sourcing output current. Consequently, output stage 10 creates significant distortion while providing a maximum output voltage swing. However, this is usually not a drawback since low supply voltage, low bandwidth designs are usually not required to have low distortion.

Prior Art FIG. 2 is an example of a conventional class AB complementary source follower output stage 30 that is a high bandwidth circuit. The class AB output stage 30 includes first and second output transistors 32 and 34 connected in series as source followers with respect to nodes A and B, respectively. A bias circuit 31 for output transistors 32 and 34 includes diode-connected transistors 40 and 42, and first and second current sources 36 and 38. Circuit input 44 is formed by the current programming input of current source 38. Although the class AB complementary output stage 30 is beneficial when a wide bandwidth, low distortion circuit having high output current is required, it does not allow the output voltage to swing close to either supply.

In both high bandwidth and low power amplification circuitry, designers use numerous techniques to accomplish various design goals. One such technique often used for increasing output current in a low quiescent current circuit has been the use of a Darlington transistor configuration.

Prior Art FIG. 3 illustrates a Darlington emitter-follower circuit 50. The Darlington circuit 50 introduces a second npn transistor 52 having a base 54 connected in series with the emitter 56 of the first npn transistor 58. In contrast to the basic output stage 10 of FIG. 1, in FIG. 3 the emitter 56 of the first npn transistor 58 drives the second npn transistor 52 which in turn supplies the output current $I_{out}$. To do so, the second npn transistor 52 draws a base current $I_{E2}$ from the emitter 56 of the first npn transistor 58.

This configuration allows additional amplification of a base current such as $I_{B2}$. For example, although $I_{E2}$ is limited to $\beta_1 * I_{B2}$, the emitter current $I_{E2}$ is amplified by the second emitter-follower transistor 52 to generate the output current $I_{out}$. Thus, assuming the first and second npn transistors 58 and 52 have current gains of $\beta_1$ and $\beta_2$, respectively, the maximum value of $I_{out} = \beta_1 * \beta_2 * I_{B2}$. Hence the potential available output current $I_{out}$ is greatly increased without increasing the quiescent current of $I_s$.

However, the additional amplification stage embodied in the second npn transistor 52 introduces its own problems. For example, an additional $V_{BE}$ voltage drop is introduced across the base 54 and the emitter 60 of the second npn transistor 52. As a result, the maximum output voltage reduces to $V_{OUT} = V_+ - V_{SAT} - 2 * V_{BE}$. The added $V_{BE}$ reduction of $V_{OUT}$ imposes a significant limitation to Darlington circuits 50, especially those running from lower-voltage power sources.

In summary, a variety of circuits exist for normal high bandwidth and low power circuitry. High bandwidth and low power circuitry applications normally have different requirements. However, there has been very little development in circuitry that has the requirements of both a high bandwidth circuit and a low power circuit. An application requiring portability would be one example where both types of requirements would need to be met to create a superior product. Since portable applications run on batteries, it would be very advantageous to use a circuit that requires a minimum number of battery cells and increases cell life by requiring a low supply current. A high speed amplifier that requires a low supply voltage would have the normal requirements of high speed circuitry, specifically high frequency and low distortion. It would also need, however, to operate on a minimum supply voltage and current.

What is needed and desirable is a circuit that allows high frequency with low distortion, but can operate with a low supply voltage and low quiescent current.

SUMMARY OF THE INVENTION

In order to achieve the foregoing and in accordance with the present invention, a variety of output stages and methods for amplifying electrical signals are disclosed.

According to a first embodiment of the present invention, a control circuit driven by a differential input voltage includes first and second input stages coupled in parallel. Each input stage has a differential input coupled to the differential input voltage and a single-ended output substantially proportional to the differential input voltage. The control circuit provides a substantially symmetrical signal pair to drive a complementary push-pull output stage, while decreasing the supply voltage requirement. The complementary push-pull output stage includes first and second push-pull amplifiers each driven by one of the input stages, with the outputs of the push-pull coupled together.

Another aspect of the present invention describes a method for controlling a complementary push-pull output stage whereby the output of the stage is formed by the coupling of the outputs of the first and second push-pull amplifiers. Two symmetrical signal paths are provided from differential inputs to one singe-ended output.

BRIEF DESCRIPTION OF THE DRAWINGS

Prior Art

Prior Art

Prior Art

BEST MODES FOR CARRYING OUT THE INVENTION

Although the Darlington output stage allows greater output current when low quiescent supply current is required, problems will arise when the Darlington configuration is used in a low voltage, high speed circuit that requires low distortion. The present invention addresses these problems by using dual signal paths to drive complementary push-pull output stages.

Figure 1:
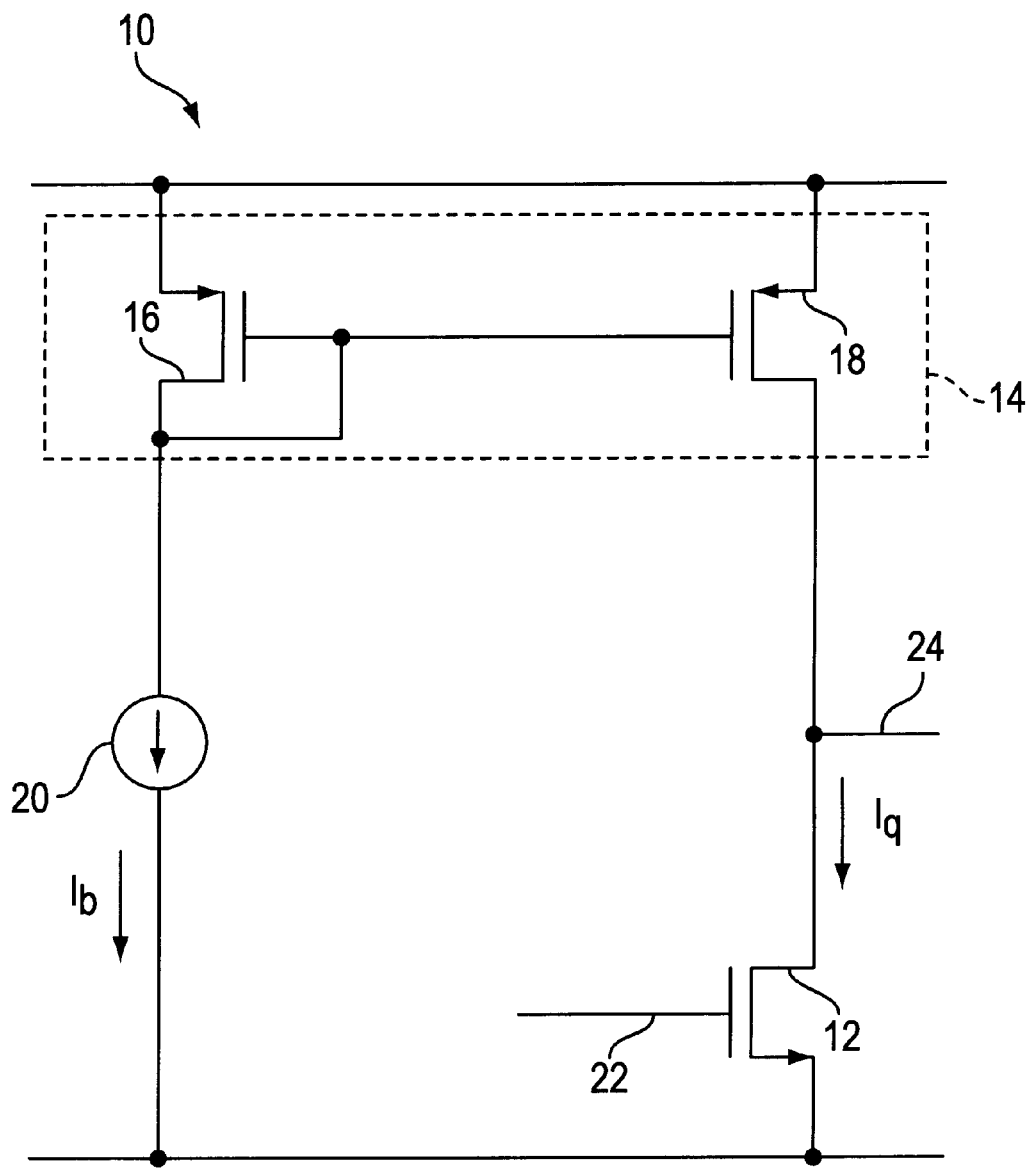
FIG. 1 is a schematic illustration of a low bandwidth, rail-to-rail output stage of the prior art.
Figure 2:
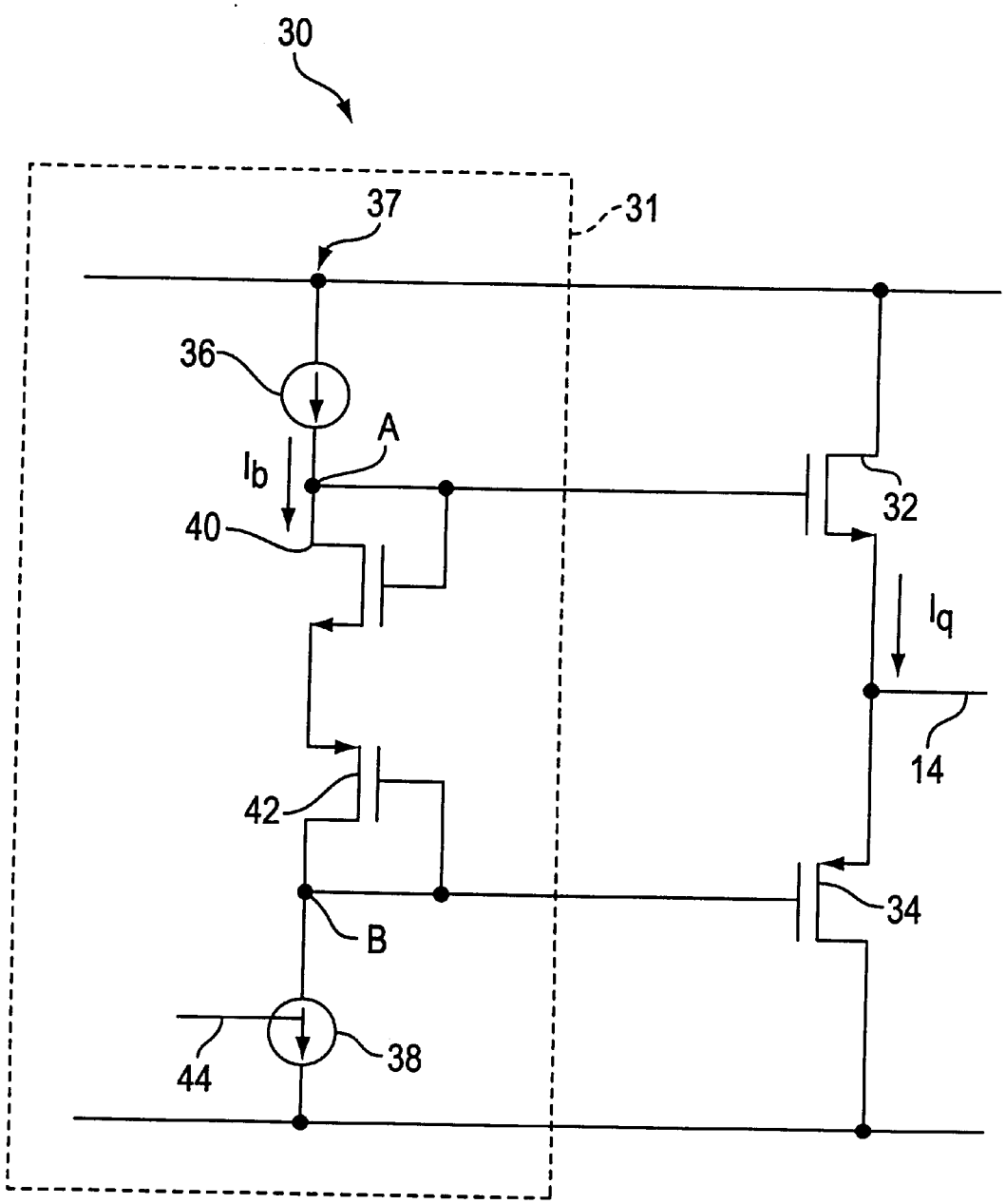
FIG. 2 is a schematic illustration of a high bandwidth, high current output stage of the prior art.
Figure 3:
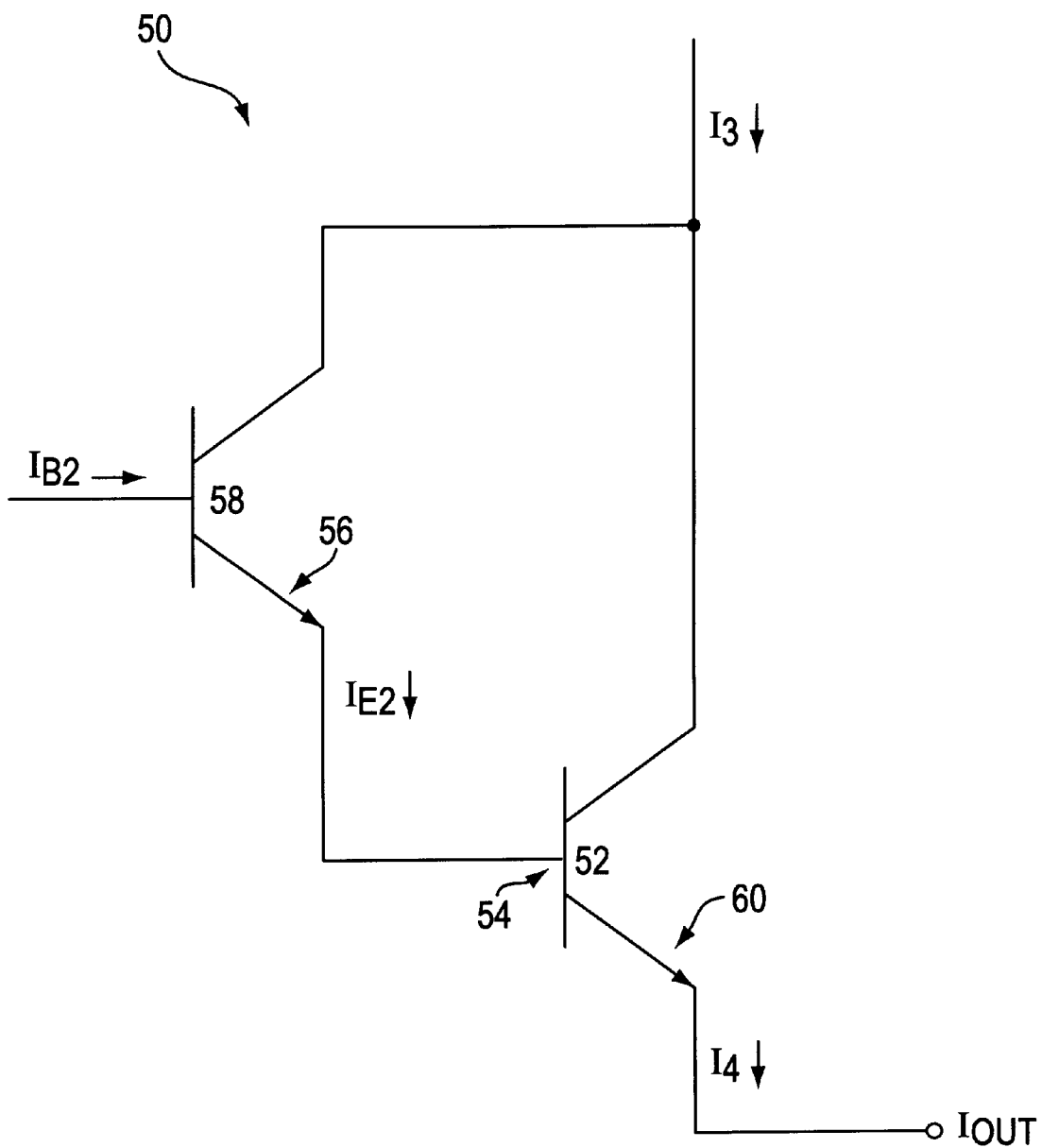
FIG. 3 is a schematic illustration of a Darlington output stage of the prior art.
Figure 4:
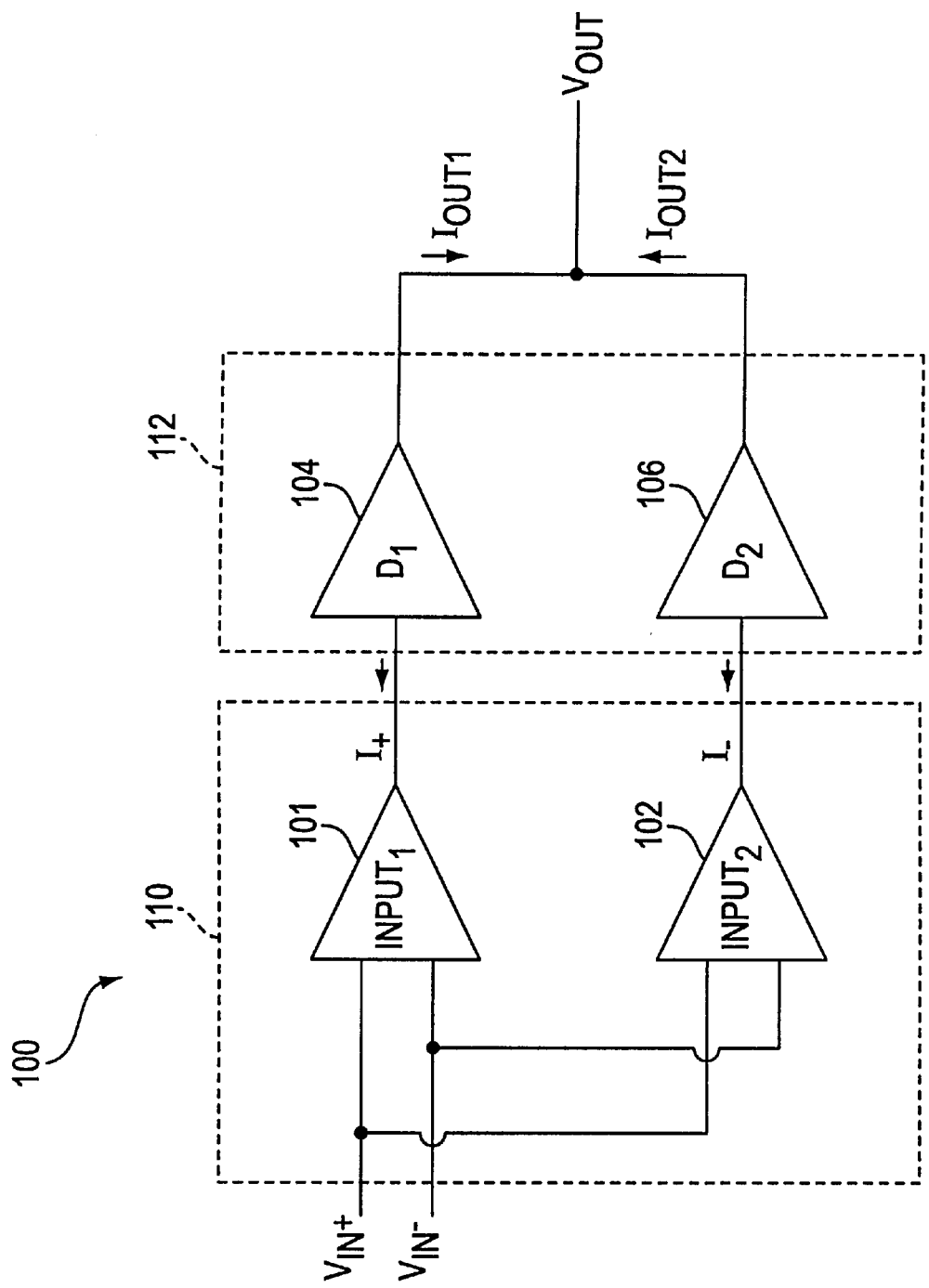
FIG. 4 is a block diagram of an amplifier in accordance with one embodiment of the present invention.

FIG. 4 shows a block diagram of an amplifier 100 in accordance with one embodiment of the present invention. The amplifier 100 includes a dual input stage 110 including input stages 101 and 102, and a complementary push-pull output stage 112 having two push-pull output stages 104 and 106 connected at their outputs. Each input stage 101 and 102 has a differential input voltage $V_{IN+}$ and $V_{IN-}$. Each stage also has a single-ended output used to drive a common-emitter push-pull transistor configuration in the dual push-pull output stage 112. Two substantially symmetrical signal paths are formed from the common differential input to the common single output.

The use of two symmetrical signal paths as shown in FIG. 4 decreases even-order harmonic distortion. The signals that are above mid supply and below mid supply are amplified through a similar configuration, thus decreasing the even-order harmonics. The second harmonic in particular is very low in the circuit topology of FIG. 4. However it should be noted that all even order harmonics are decreased by the use of the symmetrical signal paths.

Figure 5:
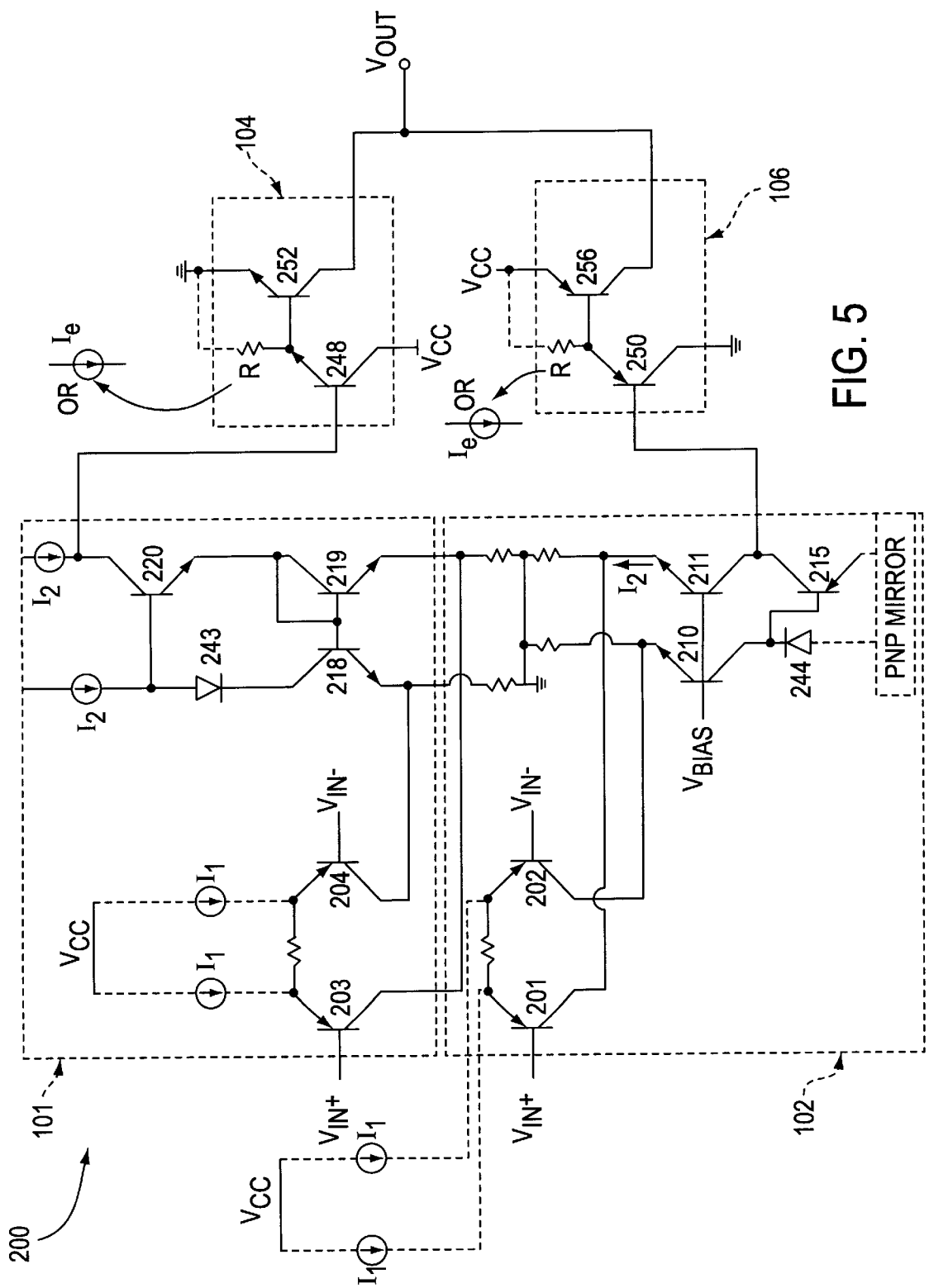
FIG. 5 is a schematic illustration of an amplifier having a control circuit and a complementary push-pull output stage in accordance with the present invention.

FIG. 5 shows a schematic illustration of an amplifier 200 having a complementary common-emitter push-pull output configuration in accordance with one embodiment of the present invention. The amplifier 200 includes a first input stage 101, a second input stage 102, a first push-pull output stage 104, and a second push-pull output stage 106. The first input stage 101 includes a differential transistor pair 203 and 204, and a folded cascode mirror arrangement having transistors 218, 219, 220 and diode 243. The second input stage 102 includes a differential transistor pair 201 and 202, and a folded cascode and mirror arrangement having transistors 210, 211, 215 and diode 244. The first push-pull output stage 104 includes transistors 248 and 252, and the second push-pull output stage 106 includes transistors 250 and 256.

The amplifier 200 of FIG. 5 operates as follows. The two symmetrical input stages 101 and 102 are used to drive the complementary push-pull output stages 104 and 106. The first path 101 uses transistors 203 and 204 as a differential pair to drive a first folded cascode mirror arrangement of transistors 218 and 219. The output of the first folded cascode and mirror arrangement is a current that flows into the collector of transistor 220. This current flows out of the base of transistor 248, the input transistor of the first npn push-pull output stage 104. Transistor 252 is the second transistor of the first npn push-pull output stage 104. Note that the common-emitter Darlington output stage inverts the output voltage relative to its input signal voltage.

The second path 102 uses transistors 201 and 202 as a differential pair to drive the emitters of common-base transistors 210 and 211. However this time the npn folded cascode output drives a pnp mirror, instead of an npn mirror as the first path. The output of the second folded cascode is a current that flows into the collector of transistor 215. This current flows out of the base of transistor 250, the input transistor of the second pnp push-pull output stage 106. Transistor 256 is the second transistor of the second pnp push-pull output stage 106. A signal voltage inversion occurs in this common-emitter stage as well.

Under certain circumstances, the quiescent bias current in the two signal paths is uncertain. The present invention addresses this issue by biasing the two Darlington output stages so that the current is substantially the same in both paths when no output current is required.

Figure 6:
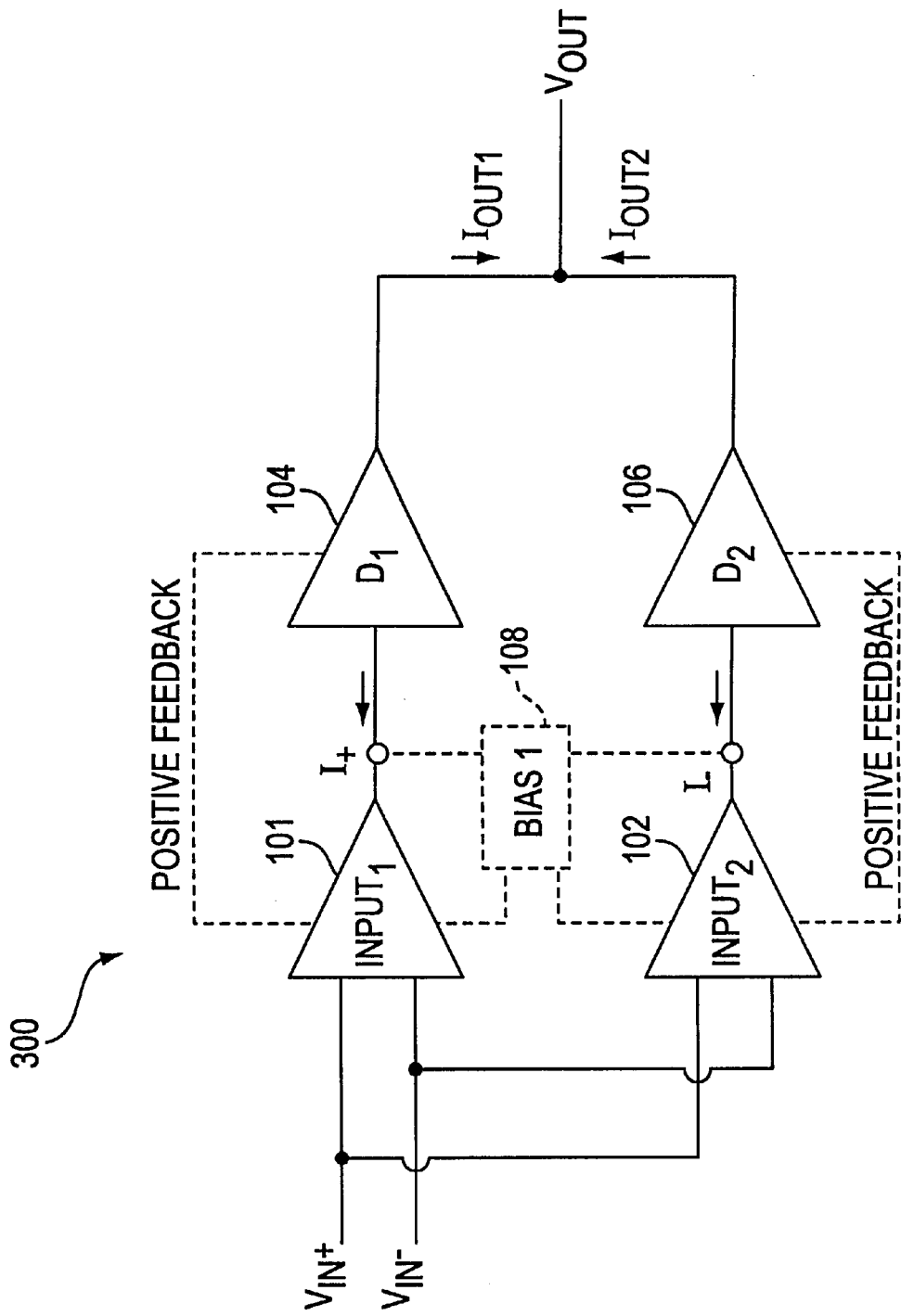
FIG. 6 is a block diagram of an amplifier in accordance with another embodiment of the present invention.

FIG. 6 shows a block diagram of an amplifier 300 in accordance with one embodiment of the present invention. The amplifier 300 of FIG. 6 is different from the amplifier 100 of FIG. 4 in that the amplifier 300 of FIG. 6 includes a bias arrangement 108. The amplifier 300 uses the bias arrangement 108 or 108a to bias the single-ended outputs of complementary input stages 101 and 102. The complementary input stages 101 and 102 in turn deliver the input currents $I_+$ and $I_-$ of the complementary push-pull output stages 104 and 106.

Figure 7A:
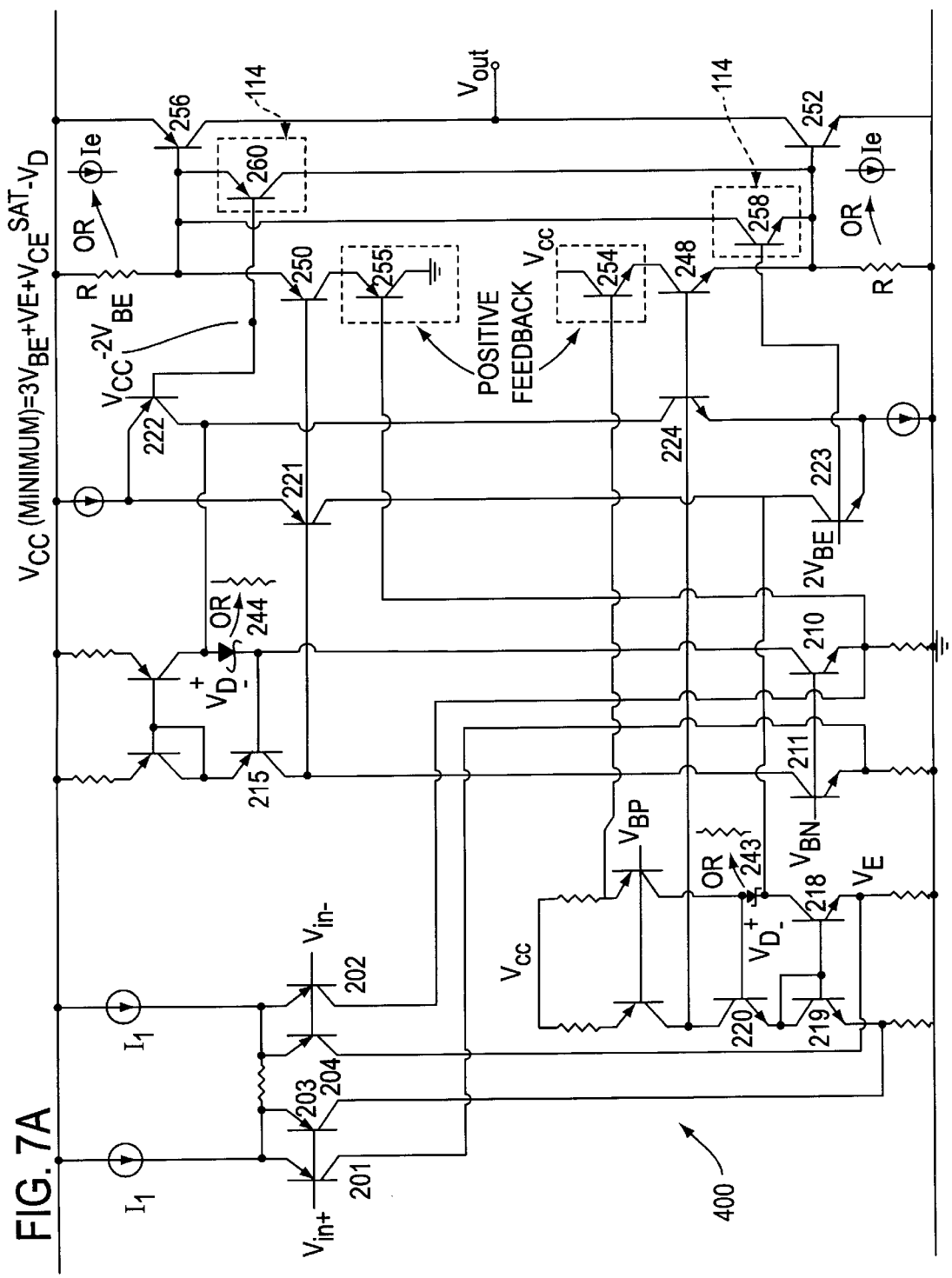
FIG. 7a is a schematic illustration of an amplifier having a control circuit and a complementary push-pull output stage including positive feedback and a very low output stage bias current in accordance with the present invention.

FIG. 7a shows a schematic illustration of an amplifier 400 having a complementary push-pull output configuration in accordance with one embodiment of the present invention, including the bias arrangement 108 discussed above. The bias arrangement 108 includes transistors 221, 222, 223, and 224. The base of transistor 222 is biased 2 $V_{BE}$ down from the top rail in order to bias the 2 $V_{BE}$ base voltage of the pnp push-pull output stage. The base of transistor 223 is biased 2φ up from the negative supply in order to bias the 2 $V_{BE}$ base voltage of the npn push-pull. In order to avoid saturation of transistors 221 and 224 as the power supply voltage is lowered, the collector of transistor 223 is connected to the cathode of Schottky diode 243, and the collector of transistor 222 is connected to the anode of Schottky diode 244. This forward biases the collector base of transistors 222 and 223 by a Schottky diode drop, typically about 0.3V. The minimum $V_{CC}$ supply voltage $V_{CC}(min.)=3V_{BE}+V_E+V^{SAT}_{CE}-V_D$. Essentially this arrangement allows the circuit to operate with a supply voltage that is 3/10 of a volt lower than connecting the collectors of 221 and 224 to their respective bases. This is 10% of a 3V supply. Thus, if a user had another part with a 3V supply and a 10% tolerance, a circuit made according to the present invention could be assured to work with it.

Figure 7B:
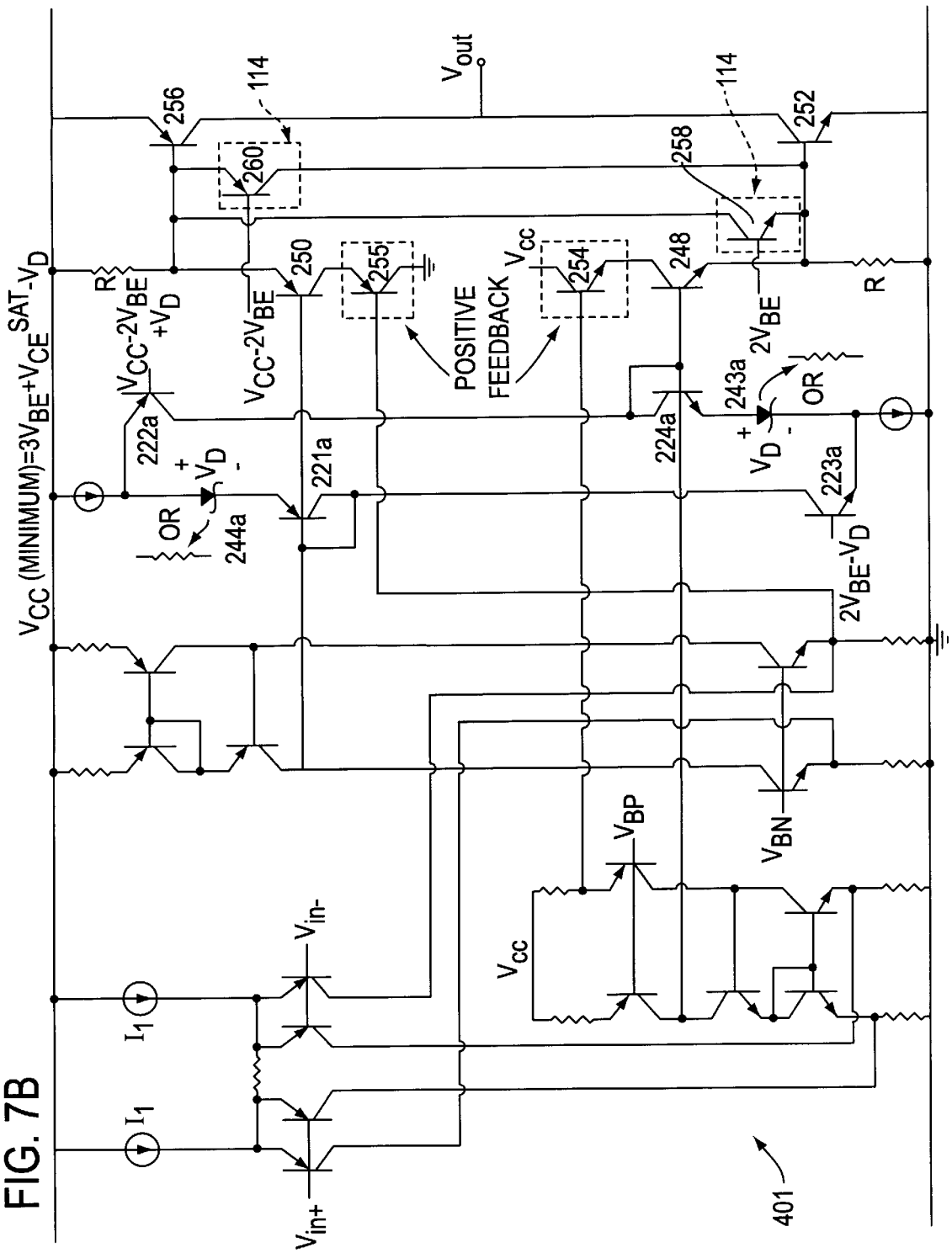
FIG. 7b is a schematic illustration of an amplifier having an alternative control circuit and a complementary push-pull output stage biased to support a very low output stage current in accordance with the present invention.

FIG. 7b shows a schematic illustration of an amplifier 401 having a complementary push-pull output configuration in accordance with another embodiment of the present invention, including the bias arrangement 108a. The bias arrangement 108a includes transistors 221a, 222a, 223a, 224a; Schottky diodes 243a, and 244a. The base of transistor 222a is biased $2V_{BE}-V_D$ down from $V_{CC}$ in order to bias the $2V_{BE}$ base of the pnp push-pull output stage since the emitter of 221a is level shifted up $V_D$ volts by diode 244a. In a similar way, transistor 223a is biased $2V_{BE}-V_D$ up from the negative supply in order to bias the $2V_{BE}$ base voltage of the npn push-pull since the emitter of 224a is level shifted down $V_D$ volts by Schottky diode 243a. With this arrangement, the minimum $V_{CC}$ supply voltage $V_{CC}$(min.)= $3V_{BE}+V^{SAT}_{CE}-V_D$. This allows the circuit to operate with a supply voltage that is less than $V_{CC}$(min.) for bias circuit 108 by $V_E$ volts which is the degeneration voltage. This may be enough to allow for a 2.5V minimum supply voltage instead of 2.7V minimum supply voltage using bias circuit 108.

It is desirable to have an amplification circuit where a current requirement at the output does not load the input stage of the amplifier. Although relatively robust, even with a Darlington arrangement loading effects exist; that is when a smaller value load resistance is placed from the output to ground, the open loop gain of the amplifier is reduced because of the loading effect reflected back into the circuit.

The present invention addresses the load problem by introducing positive feedback. There are two critical things that are necessary to make the positive feedback work. One is that the correct node must be chosen to connect the feedback current so that positive rather than negative feedback is achieved. The second is that the positive feedback gain must be less than unity. If the feedback gain is greater than unity the circuit will oscillate.

FIG. 7a and 7b illustrate the use of positive feedback in amplifier 400 and 401 according to one embodiment of the present invention. In addition to the bias arrangement 108 and 108a discussed above with reference to FIG. 5, amplifiers 400 and 401 also include positive feedback transistors 254 and 255. The present invention senses the current that is required by the push-pull output stages. Transistors 254 and 255 sample the collector current of the push-pull input transistors 248 and 250, then feed back to the appropriate point of the input stage in such a way that positive feedback is achieved. The positive feedback works such that as the output is loaded, current that opposes that loading is injected back into the input stage.

The embodiment of the present invention illustrated in FIG. 7a without bias 114 was designed to operate on a current of about 1.6 mA. However, if the operating current is dropped to about 600 µA the circuits illustrated in FIG. 7a will have problems with settling time. At that operating current, if the output voltage $V_{OUT}$ is swung to either one rail or the other, the opposite transistor will turn off causing a long settling time in the output signal. For example, if the output is pulled high the pnp output transistor 256 will be turned on. However, transistor 252 will turn off completely. Thus, when the output signal gets to its final destination, it will take a long time to settle because transistor 252 will have to come back on a small amount.

The present invention addresses this issue by adding a second bias 114 to the output transistors of the complementary push-pull output configuration thereby allowing the circuit to operate on a current of about 600 µA. Transistors 258 and 260 may be biased off the same 2ϕ node that is used to bias the base of transistors 223 and 222 in bias circuit 108 of FIG. 7a. Transistors 258 and 260 prevent the opposite push-pull output transistor from turning off completely, and set the minimum quiescent current for those devices. For the circuit shown in FIG. 7a the amount of minimum current depends on the area ratio between transistors 258 and 248, and transistors 260 and 250, as shown in the following equations:

$$I_C^{min}(\text{Transistor256})=[I_C^{nom}(\text{Transistor256})]\times[A(\text{Transistor260})/A(\text{Transistor250})]$$

$$I_C^{min}(\text{Transistor252})=[I_C^{nom}(\text{Transistor252})]\times[A(\text{Transistor258})/A(\text{Transistor248})]$$

This in turn addresses the settling problem when operating at a total circuit quiescent current of about 600 µA. Transistors 258 and 260 also boost the impedence at the base of transistors 248 and 250 by supplying base current to 252 and 256. This reduces the signal current required from 248 and 250 so that there is even less loading effect at the output than the circuit of FIG. 7a without second bias 114. This enables the open loop gain to be as high for the 600 µA version with bias 114 as in the 1.6 mA version without bias 114.

While many of the described embodiments are referred to as output stages, this is a term of the art and is not intended to be limiting. The circuit of the present invention is suitable in any application wherein a buffer amplifier, power amplifier, etc. is required.

Therefore, the present examples and embodiments are to be considered as illustrative and not restrictive, and the invention is not to be limited to the details given herein, but may be modified within the scope of the appended claims.

I claim:

1. A control circuit driven by a differential input voltage, the control circuit suitable for driving a complementary push-pull common-emitter output stage, the control circuit comprising:
   a first stage having a first single-ended output and a first differential input coupled to the differential input voltage, the first stage operable to generate a first current signal at the single-ended output, the first current signal being substantially proportional to the differential input voltage, the first stage including a first transconductance device having an input that is the first differential input and a folded cascade amplifier coupled in parallel with the first differential pair of transistors, the folded cascade amplifier including a Schottky diode; and
   a second stage having a second single-ended output and a second differential input coupled to the differential input voltage, the second stage operable to generate a second current signal at the single-ended output, the second current signal being substantially proportional to the differential input voltage;
   wherein the first and second stages are connected in parallel, the first and second current signals providing a substantially symmetrical signal pair for driving a complementary push-pull output stage.

2. A control circuit as recited in claim 1 wherein the first transconductance device includes a first differential pair of transistors.

3. A control circuit as recited in claim 2 wherein the first differential pair of transistors are bipolar devices.

4. A control circuit as recited in claim 1 wherein the folded cascade amplifier includes a first transistor and a current mirror.

5. A control circuit as recited in claim 4, wherein the first transistor and the current mirror are bipolar devices.

6. A control circuit as recited in claim 1, wherein the second stage includes a second differential pair of transistors and a second folded cascode amplifier.

7. A control circuit as recited in claim 1, wherein the first stage includes a first folded cascode amplifier and the second stage includes a second folded cascode amplifier, the control circuit further comprising:
- a first bias circuit coupled to the first stage; and
- a second bias circuit coupled to the second stage,
- wherein the first and second bias circuits are arranged to enhance the symmetry between the first and second current signals provided to the complementary push-pull output stage.

8. A control circuit as recited in claim 1 wherein the first folded cascade amplifier includes the Schottky diode, a first transistor, and a first current mirror, and the second stage includes a second folded cascade amplifier which further includes a second Schottky diode, a second transistor, and a second current mirror.

9. A control circuit as recited in claim 8 wherein the first folded cascode amplifier is arranged such that the first Schottky diode is operable to forward bias the first bias circuit, and the second folded cascode amplifier is arranged such that the second Schottky diode is operable to forward bias the second bias circuit.

10. A control circuit as recited in claim 9 wherein the forward biasing effect of the first and second bias circuits is sufficient to decrease a voltage drop measured between the outputs of the first and second bias circuits and a power supply provided to the first and second bias circuits.

11. A control circuit as recited in claim 1 further comprising:
- a third bias circuit connected to the input of the output transistor of the first push-pull output stage;
- a fourth bias circuit connected to the input of the output transistor of the second push-pull output stage;
- wherein the third and fourth bias circuits prevent the Darlington output transistors from turning off.

12. A control circuit as recited in claim 1 wherein the first and second bias circuits include differential pair transistors having built-in offset voltage from a level shift such that a minimum required supply voltage is reduced.

13. A control circuit as recited in claim 1 further comprising a positive feedback circuit wherein the positive feedback circuit produces a positive current which opposes a load placed on the output of the circuit.

14. An output stage amplifier comprising:
- a control circuit driven by a differential input voltage, the control circuit including:
  - a first input stage having a first single-ended output and a first differential input coupled to the differential input voltage, the first input stage operable to generate a first current signal at the single-ended output, the first current signal being substantially proportional to the differential input signal, the first input stage including a first transconductance device, comprising a first differential pair of transistors and a folded cascade amplifier including a Schottky diode, the folded cascade amplifier being coupled in parallel with the first differential pair of transistors, and the first input stage having an input that is the first differential input;
  - a second input stage having a second single-ended output and a second differential input coupled to the differential input voltage, the second stage operable to generate a second current signal at the single-ended output, the second current signal being substantially proportional to the differential input voltage,
  - wherein the first and second input stages are connected in-parallel, the first and second current signals providing a substantially symmetrical signal pair; and
- a complementary push-pull output stage including first and second push-pull amplifiers each having an output, the first amplifier driven by the first input stage and the second push-pull amplifier driven by the second input stage, the outputs of the first and second push-pull amplifiers being coupled together, such that two complementary signal paths are provided from input to output.

15. An output stage amplifier as recited in claim 11 wherein the first differential pair of transistors are bipolar devices.

16. An output stage amplifier as recited in claim 15 wherein the folded cascode amplifier includes, a first transistor and a current mirror.

17. An output stage amplifier as recited in claim 16, wherein the first transistor and the current mirror are bipolar devices.

18. An output stage amplifier as recited in claim 17, wherein the second input stage includes a second differential pair of transistors and a second folded cascode amplifier.

19. An output stage amplifier as recited in claim 14, wherein the first input stage includes a first folded cascode amplifier and the second input stage includes a second folded cascode amplifier, the control circuit further comprising:
- a first bias circuit coupled to the first input stage; and
- a second bias circuit coupled to the second input stage,
- wherein the first and second bias circuits are arranged to enhance the symmetry between the first and second current signals provided to the complementary Darlington common-emitter output stage.

20. An output stage amplifier as recited in claim 19 wherein the first input stage includes a first folded cascode amplifier and the second input stage includes a second folded cascode amplifier.

21. An output stage amplifier as recited in claim 20 wherein the first folded cascode amplifier includes a first Schottky diode, a first transistor, and a first current mirror, and the second folded cascode amplifier includes a second Schottky diode, a second transistor, and a second current mirror.

22. An output stage amplifier as recited in claim 21 wherein the first folded cascode amplifier is arranged such that the first Schottky diode is operable to forward bias the first bias circuit, and the second folded cascode amplifier is arranged such that the second Schottky diode is operable to forward bias the second bias circuit.

23. An output stage amplifier as recited in claim 22 wherein the forward biasing effect of the first and second bias circuits is sufficient to decrease a voltage drop measured between the outputs of the first and second bias circuits and a power supply provided to the first and second bias circuits.

24. An output stage amplifier as recited in claim 23 further comprising:
- a third bias circuit connected to the input of the output transistor of the first Darlington output stage;
- a fourth bias circuit connected to the input of the output transistor of the second Darlington output stage;

wherein the third and fourth bias circuits prevent the Darlington output transistors from turning off.

25. An output stage amplifier as recited in claim 19 wherein the first and second bias circuits include differential pair transistors having built-in offset voltage from a level shift such that a minimum required supply voltage is reduced.

26. An output stage amplifier as recited in claim 14 further comprising a positive feedback circuit wherein the positive feedback circuit produces a current which opposes a load placed on the output of the circuit.

27. A method for controlling a complementary push-pull output stage having first and second push-pull amplifiers each having an input and an output, an output of the complementary push-pull output stage being formed by coupling of the outputs of the first and second push-pull amplifiers, the method comprising the act of providing substantially symmetrical input signals to the first push-pull input and the second push-pull input, whereby:

a first input stage having a first single-ended output and a first differential input coupled to a differential input voltage, the first input stage operable to generate a first current signal at the single-ended output, the first current signal being substantially proportional to the differential input signal, the first input stage including a first transconductance device, comprising a first differential pair of transistors and a folded cascode amplifier including a Schottky diode, the folded cascode amplifier being coupled in parallel with the first differential pair of transistors, and the first input stage having an input that is the first differential input; and a second input stage having a second single-ended output and a second differential input coupled to the differential input voltage, the second stage operable to generate a second current signal at the single-ended output, the second current signal being substantially proportional to the differential input voltage, wherein the first and second input stages are connected in parallel, the first and second current signals providing a substantially symmetrical signal pair for driving the complementary push-pull output stage, thus providing two signal paths from input to output.

28. A method for controlling a complementary push-pull output stage as recited in claim 1 wherein the first differential pair of transistors are bipolar devices.

29. A method for controlling a complementary push-pull output stage as recited in claim 28 wherein the folded cascode amplifier includes, a first transistor and a current mirror.

30. A method for controlling a complementary push-pull output stage as recited in claim 29, wherein the first transistor and the current mirror are bipolar devices.

31. A method for controlling a complementary push-pull output stage as recited in claim 1, wherein the second input stage includes a second differential pair of transistors and a second folded cascode amplifier.

32. A method for controlling a complementary push-pull output stage as recited in claim 27, wherein the first input stage includes a first folded cascode amplifier and the second input stage includes a second folded cascode amplifier, the control circuit further comprising:

a first bias circuit coupled to the first input stage; and a second bias circuit coupled to the second input stage, wherein the first and second bias circuits are arranged to enhance the symmetry between the first and second current signals provided to the complementary push-pull output stage.

33. A method for controlling a complementary push-pull output stage as recited in claim 32 wherein the first input stage includes a first folded cascode amplifier and the second input stage includes a second folded cascode amplifier.

34. A method for controlling a complementary push-pull output stage as recited in claim 33 wherein the first folded cascode amplifier includes a first Schottky diode, a first transistor, and a first current mirror, and the second folded cascode amplifier includes a second Schottky diode, a second transistor, and a second current mirror.

35. A method for controlling a complementary push-pull output stage as recited in claim 34 wherein the first folded cascode amplifier is arranged such that the first Schottky diode is operable to forward bias the first bias circuit, and the second folded cascode amplifier is arranged such that the second Schottky diode is operable to forward bias the second bias circuit.

36. A method for controlling a complementary push-pull output stage as recited in claim 35 wherein the forward biasing effect of the first and second bias circuits is sufficient to decrease a voltage drop measured between the outputs of the first and second bias circuits and a power supply provided to the first and second bias circuits.

37. A method for controlling a complementary push-pull output stage as recited in claim 36 wherein:

a third bias circuit is connected to the input of the output transistor of the first push-pull output stage; and a fourth bias circuit is connected to the input of the output transistor of the second push-pull output stage;

wherein the third and fourth bias circuits prevent the Darlington output transistors from turning off.

38. A method for controlling a complementary push-pull output stage as recited in claim 32 wherein the first and second bias circuits include differential pair transistors having built-in offset voltage from a level shift such that a minimum required supply voltage is reduced.

39. A method for controlling a complementary push-pull output stage as recited in claim 27 further comprising the act of providing a positive feedback circuit wherein the positive feedback circuit produces a current which opposes a load placed on the output of the circuit.

* * * * *